(12) United States Patent
Tan et al.

(10) Patent No.: US 9,905,711 B2
(45) Date of Patent: Feb. 27, 2018

(54) AVALANCHE PHOTO DETECTOR DEVICE AND MANUFACTURING METHOD THEREOF

(71) Applicant: UNITED MICROELECTRONICS CORP., Hsin-Chu (TW)

(72) Inventors: Tzung-Han Tan, Taipei (TW); Chang-Sheng Hsu, Hsinchu (TW); Meng-Jia Lin, Changhua County (TW); Te-Huang Chiu, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 66 days.

(21) Appl. No.: 15/099,610

(22) Filed: Apr. 15, 2016

(65) Prior Publication Data
US 2017/0271529 A1 Sep. 21, 2017

(30) Foreign Application Priority Data

Mar. 17, 2016 (CN) .......................... 2016 1 0153622

(51) Int. Cl.
*H01L 31/024* (2014.01)
*H01L 31/0232* (2014.01)
*H01L 31/0352* (2006.01)
*H01L 31/105* (2006.01)
*H01L 31/18* (2006.01)
*H01L 31/107* (2006.01)

(52) U.S. Cl.
CPC ...... *H01L 31/024* (2013.01); *H01L 31/02327* (2013.01); *H01L 31/035281* (2013.01); *H01L 31/105* (2013.01); *H01L 31/107* (2013.01); *H01L 31/18* (2013.01)

(58) Field of Classification Search
CPC ............. H01L 31/024; H01L 31/02327; H01L 31/035281; H01L 31/105; H01L 31/18; H01L 31/107; H01L 2023/4043; H01L 2023/405; H01L 2023/4037
See application file for complete search history.

*Primary Examiner* — Steven Loke
*Assistant Examiner* — Juanita Rhodes
(74) *Attorney, Agent, or Firm* — Winston Hsu (57) ABSTRACT

An avalanche photodetector device includes a substrate having a front side and a back side, an avalanche photo detector structure disposed on the front side of the substrate, a plurality of heat sinks disposed on the back side of the substrate, and a plurality of reflecting islands disposed on the back side of the substrate.

19 Claims, 7 Drawing Sheets

AVALANCHE PHOTO DETECTOR DEVICE AND MANUFACTURING METHOD THEREOF

BACKGROUND OF THE INVENTION

1. Field of the Invention

The invention relates to an avalanche photo detector (hereinafter abbreviated as APD) device and a manufacturing method thereof, and more particularly, to an APD device including heat sinks and a manufacturing method thereof.

2. Description of the Prior Art

APD devices are sensitive semiconductor photo detectors, and are used in applications where high sensitivity is desired, such as, example but not limited, a long haul fiber-optic telecommunication, Laser rangefinders, and single photo level detection and imaging. Conventionally, the APD devices can include at least silicon (Si) and germanium (Ge). For example, in a Si/Ge separate absorption charge multiplication (SACM) APD device, Ge provides high responsibility at near-infrared wavelengths (850 nanometers, (hereinafter abbreviated as nm)) while Si is capable of amplifying the generated photo-carriers with low noise. APD devices formed from Si and Ge therefore can provide devices capable of detecting near-infrared optical signals. However, other materials APD devices and SACM. APD devices can be formed from, for example but not limited to, groups III and V of the periodic table such as InGaAs, InGaAsP, and InP, and combinations thereof. The APD device therefore can detect light with wavelength of about not only 850 nm but also 1310 nm nm or 1577 nm.

SUMMARY OF THE INVENTION

According to an aspect of the present invention, there is provided an APD device. The APD device includes a substrate comprising a front side and a back side, at least an APD structure disposed on the front side of the substrate, a plurality of heat sinks disposed on the back side of the substrate, and a plurality reflecting islands disposed on the back side of the substrate.

According to an aspect of the present invention, there is provided a method for manufacturing an APD device. The method includes following steps. A substrate including a front side and a back side is provided. An APD structure is then formed on the front side of the substrate and followed by patterning the back side of the substrate to form a plurality of heat sinks on the back side of the substrate and a plurality of recesses defined in between the heat sinks. Next, a plurality of reflecting islands are formed on bottoms of the recesses, respectively.

According to the APD device provided by the present invention, at least an APD structure is formed on the front side of the substrate while the reflecting islands and the heat sinks are formed on the back sides of the substrate. Accordingly, lights passing through the APD structure are reflected back to it by the reflecting islands, and thus responsibility and sensitivity of the APD device are improved. More important, the heat sinks improve heat dissipation by increasing thermal paths. Consequently, impacts to the device performance due to overheat is diminished.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawing illustrating a method for manufacturing an APD device provided by a first preferred embodiment of the present invention, wherein

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
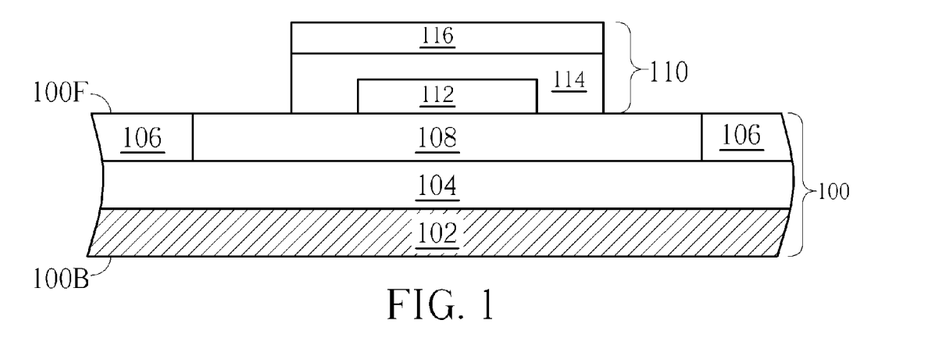

Please refer to FIGS. 1-7, which are schematic drawings illustrating a method for manufacturing an APD device provided by a first preferred embodiment of the present invention. As shown in FIG. 1, according to the method for manufacturing the APD structure provided by the present invention, a substrate 100 including a front side 100F and a back side 100B is provided. In some embodiments of the present invention, the substrate 100 is preferably a silicon-on-insulator (hereinafter abbreviated as SOI) substrate, but not limited to this. It is well-known to those skilled in the art that the SOI substrate upwardly includes a silicon layer 102, a bottom oxide (hereinafter abbreviated as BOX) layer 104, and a semiconductor layer 106 such as a single crystalline silicon layer formed on the BOX layer 104. Furthermore, in some embodiments of the present invention, the semiconductor layer 106 formed on the BOX layer 104 further includes an n-doped region 108. It is noteworthy that a semiconductor mesa 110 is formed on the semiconductor layer 106, and the semiconductor mesa 110 upwardly and sequentially includes an n-doped semiconductor layer 112, an intrinsic semiconductor layer 114, and a p-doped semiconductor layer 116 as shown in FIG. 1. In some embodiments of the present invention, a concentration of the n-doped semiconductor layer 112 is lower than a concentration of the n-doped region 108. Additionally, the intrinsic semiconductor layer 114 is an undoped semiconductor layer. In other words, the intrinsic semiconductor layer 114 includes no conductive dopants. However, it should be easily realized by those skilled in the art that layers and concentration of the layers of the semiconductor mesa 110 can be modified and adjusted according to different product requirements.

Figure 2:
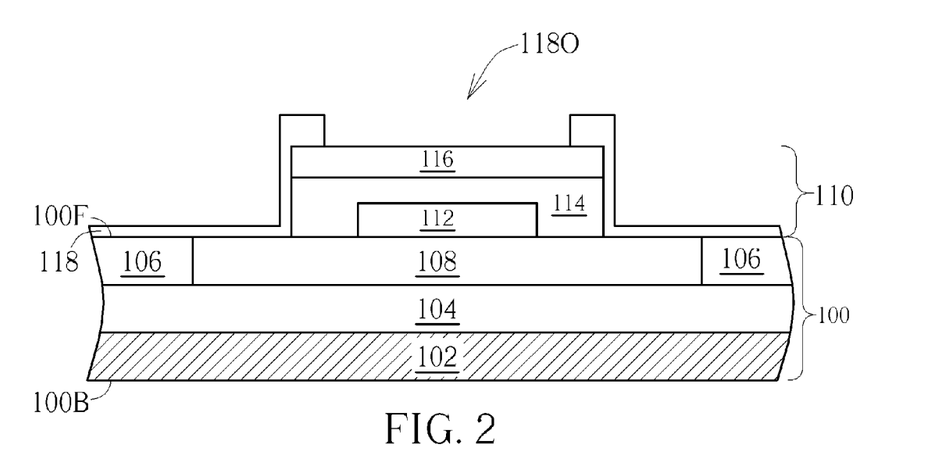
FIG. 2 is a schematic drawing in a step subsequent to FIG. 1.
Figure 3:
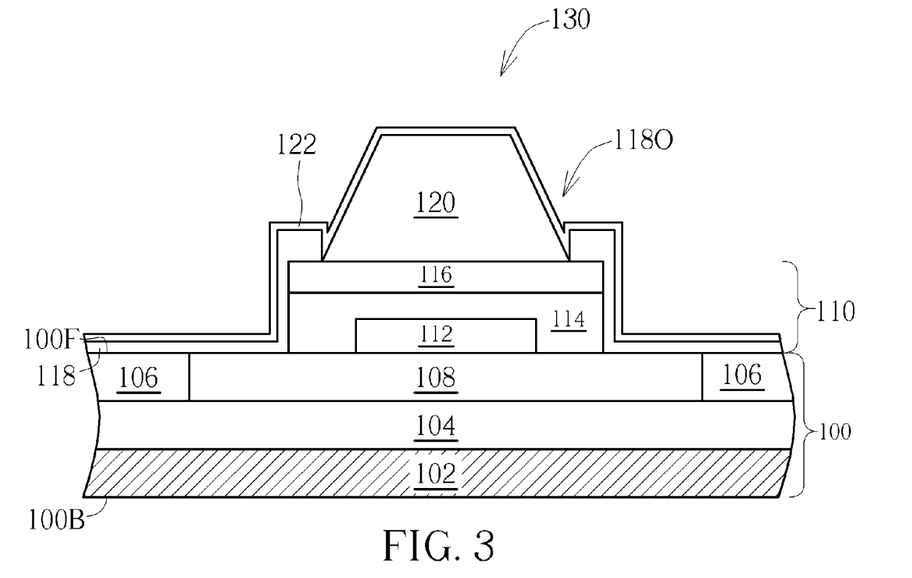
FIG. 3 is a schematic drawing in a step subsequent to FIG. 2.

Please refer to FIGS. 2 and 3. Next, a patterned oxide layer 118 is formed on the front side 100F of the substrate 100. The patterned oxide layer 118 includes an opening 118O, and the semiconductor mesa 110 is exposed on a bottom of the opening 118O as shown in FIG. 2. Then, an epitaxial semiconductor layer 120 is formed in the opening 118O. In some embodiments of the present invention, the epitaxial semiconductor layer 120 can be formed by a selective epitaxial growth (hereinafter abbreviated as SEG) method, but not limited to this. Consequently, the epitaxial semiconductor layer 120 formed in the opening 118O, and the p-doped semiconductor layer 116, the intrinsic semiconductor layer 114 and the n-doped semiconductor layer 112 of the semiconductor mesa 110 form an APD structure 130 as shown in FIG. 3.

Please still refer to FIG. 3. After forming the epitaxial semiconductor layer 120 by the SEG method and thus constructing the APD structure 130, a deposition process can be in-situ performed to form an amorphous silicon layer 122 on the front side 110F of the substrate 100. A thickness of the amorphous silicon layer 122 can be 1 angstrom (Å), but not limited to this.

Figure 4:
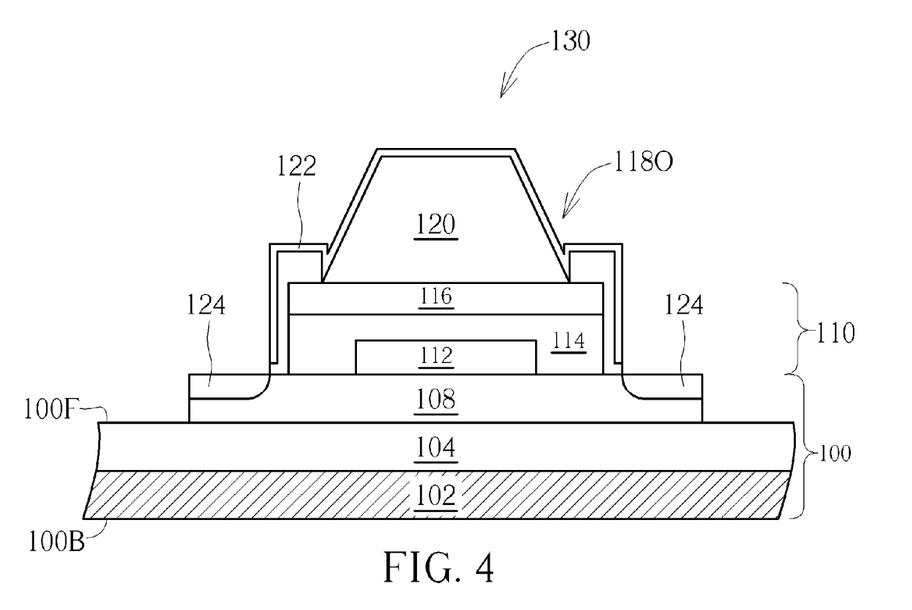
FIG. 4 is a schematic drawing in a step subsequent to FIG. 3.

Please refer to FIG. 4. After forming the amorphous silicon layer 122, a patterned protecting layer (not shown) is formed on the front side 100F of the substrate 100, and the patterned protecting layer covers and protects the semiconductor mesa 110. Thereafter, an etching process is performed to remove a portion of the amorphous silicon layer 122 not covered and protected by the patterned protecting layer. Consequently, the semiconductor layer 106 and a portion of the n-doped region 108 are exposed and followed by performing an ion implantation. Thus, a heavily n-doped region 124 is formed in the exposed semiconductor layer 106. In some embodiments of the present invention, a concentration of the heavily n-doped region 124 is larger than a concentration of the n-doped region 108, and the concentration of the n-doped region 108 is larger than a concentration of the n-doped semiconductor layer 112 of the semiconductor mesa 110. Please refer to FIG. 4 still. After forming the heavily n-doped region 124, another patterned protecting layer (not shown) is formed to cover and protect the APD structure 130 and the heavily n-doped region 124. An etching process is then performed to remove the semiconductor layer 106 not covered by the patterned protecting layer such that the BOX layer 104 is exposed as shown in FIG. 4.

Figure 5:
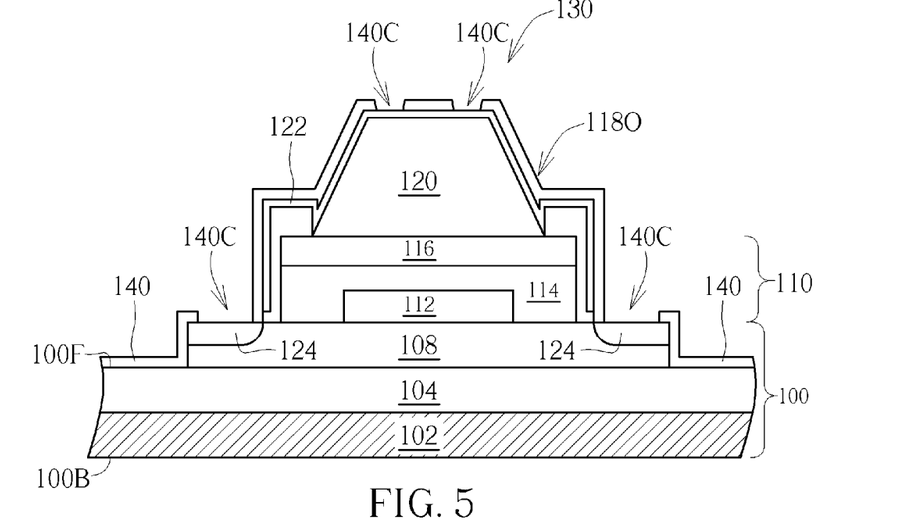
FIG. 5 is a schematic drawing in a step subsequent to FIG. 4.

Please refer to FIG. 5. Next, a dielectric layer 140 is formed on the front side 100F of the substrate 100. In some embodiments of the present invention, the dielectric layer 140 can be an interlayer dielectric (ILD) layer, but not limited to this. A plurality of openings 140C are then formed in the dielectric layer 140. Thus, the heavily n-doped region 124 and a portion of the amorphous silicon layer 122 formed on the epitaxial semiconductor layer 120 are exposed by the openings 140C as shown in FIG. 5. It is noteworthy that a silicide process can be performed before forming the dielectric layer 140 or performed after forming the dielectric layer 140 and the openings 140C. Thus metal silicides (not shown) are formed on surfaces of the heavily n-doped region 124 and the portion of the amorphous silicon layer 122 formed on the epitaxial semiconductor layer 120.

Figure 6:
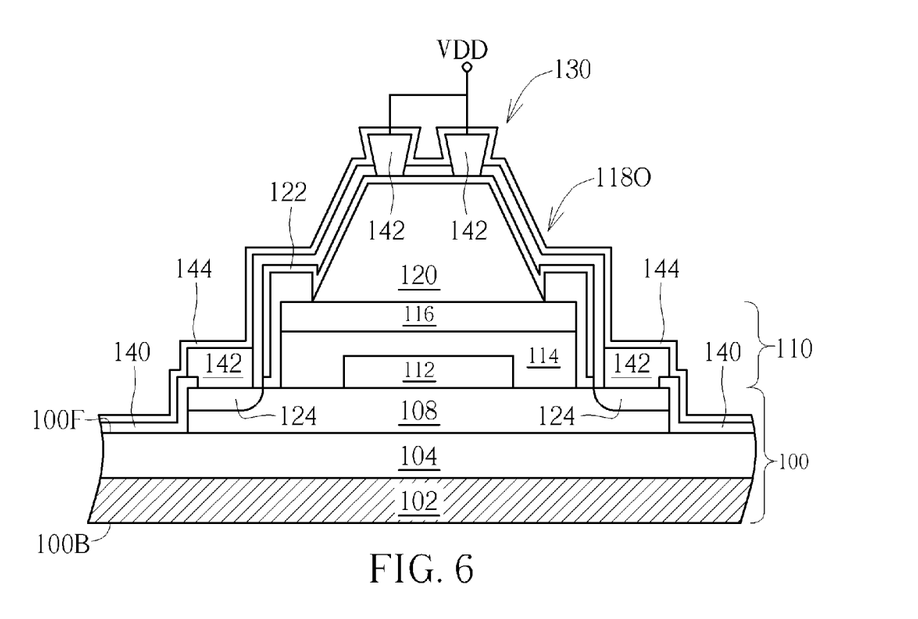
FIG. 6 is a schematic drawing in a step subsequent to FIG. 5.

Please refer to FIG. 6. Next, a conductive structure 142 is formed in the openings 140C, respectively. As shown in FIG. 6, some conductive structures 142 are electrically connected to APD structure 130, and the other conductive structures 142 are electrically connected to the heavily n-doped region 124 in the n-doped region 108. In some embodiments of the present invention, the conductive structures 142 electrically connected to the APD structure 130 are further electrically connected to a supply voltage VDD while the conductive structures 142 electrically connected to the heavily n-doped region 124 are further electrically connected to a ground voltage VSS. And in some embodiments of the present invention, the conductive structures 142 can be a first metal layer of an interconnection, but not limited to this. After forming the conductive structures 142, an anti-reflection layer 144 is formed on the front side 100F of the substrate 100 to cover the APD structure 130 and the front side 100F of the substrate 100.

Figure 7:
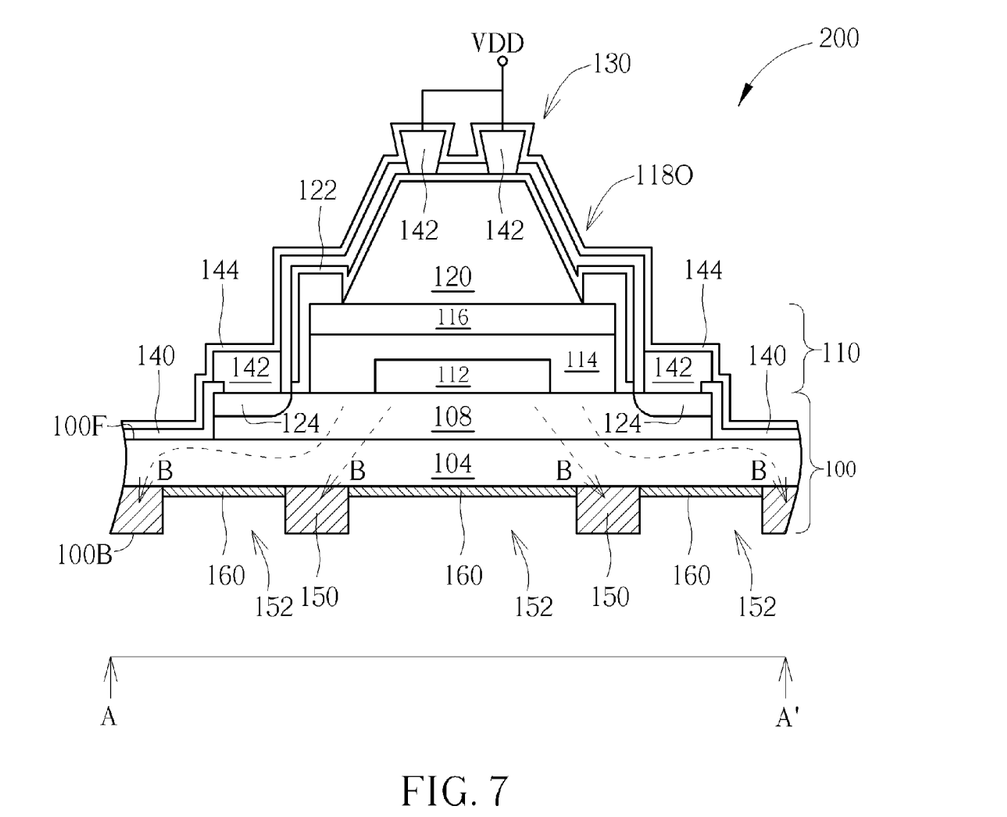
FIG. 7 is a schematic drawing in a step subsequent to FIG. 6.

Please refer to FIG. 7. After forming the APD structure 130, the dielectric layer 140, and the conductive structures 142, a protecting layer and a carrier substrate (both not shown) are formed on the front side 100F of the substrate 100. Then, the substrate 100 is flipped and followed by patterning the back side 100B of the substrate 100. Consequently, the back side 100B of the substrate 100 is patterned, thus a plurality of heat sinks 150 are formed on the back side 100B of the substrate 100 and a plurality of recesses 152 are defined therebetween as shown in FIG. 7. It is noteworthy that the substrate 100 is patterned from the back side 100B to the front side 100F of the SOI substrate 100. In other words, the silicon layer 102 of the SOI substrate 100 is etched and patterned such that the BOX layer 104 is exposed on bottoms of the recesses 152. It should be easily realized by those skilled in the art that in some embodiments of the present invention, the silicon layer 102 is remained and thus exposed on the bottoms of the recesses 152 by modifying and adjusting parameters of the patterning step.

Please still refer to FIG. 7. After forming the heat sinks 150 and the recesses 152 defined therebetween, a metal layer is formed on the bottoms of the recesses 152, respectively. The metal layer respectively serves as a reflecting structure 160 for the APD structure 130. As shown in FIG. 7, the metal layer in each recess 152 is referred as a reflecting island 160. And a thickness of the heat sinks 150 is larger than a thickness of the reflecting islands 160. Therefore the reflecting islands 160 are spaced apart from each other by the heat sinks 150. Briefly speaking, the heat sinks 150 include a semiconductor material, and the semiconductor material is the same with at least a portion of the substrate 100 while the reflecting structures (the reflecting islands) 160 include metal materials. As mentioned above, since the heat sinks 150 are formed by patterning the silicon layer 102 of the SOI substrate 100, the heat sinks 150 includes the semiconductor material the same with the silicon layer 102 of the substrate 100. Consequently, an APD device 200 including the APD structure 130, the reflecting structures 160, and the heat sinks 150 is obtained, as shown in FIG. 7.

Figure 8:
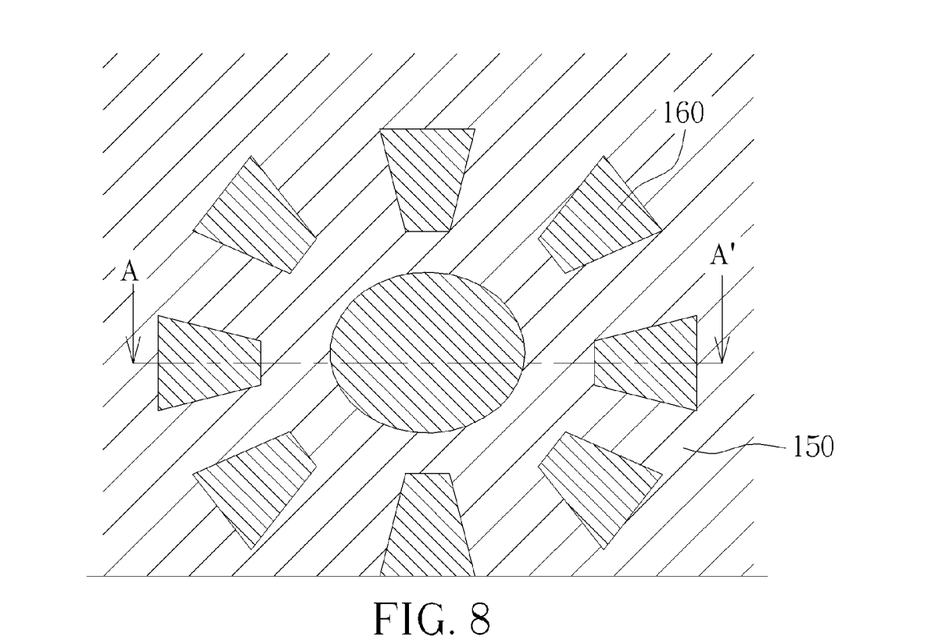
FIGS. 8-11 are top views of the back side of the APD structures provided by different embodiments of the present invention, respectively.
Figure 9:
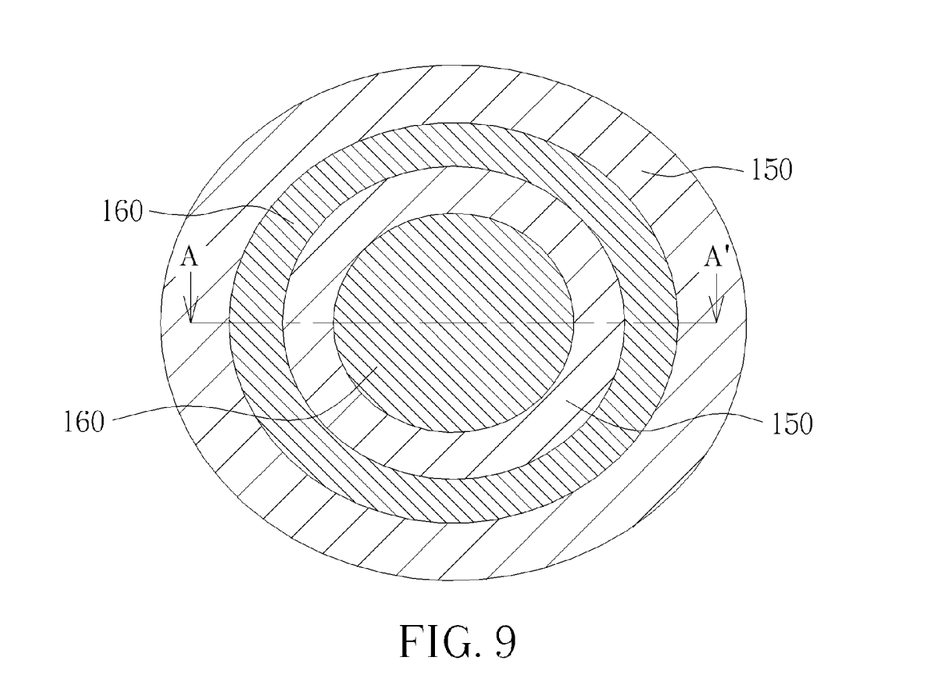
Figure 10:
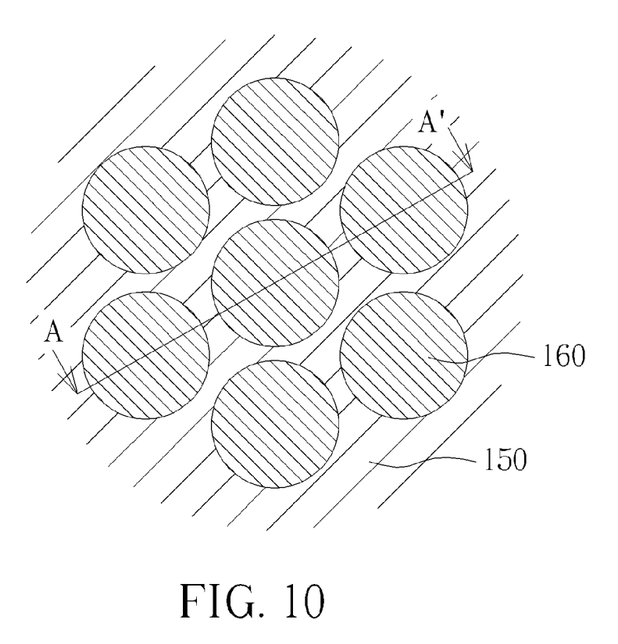
Figure 11:
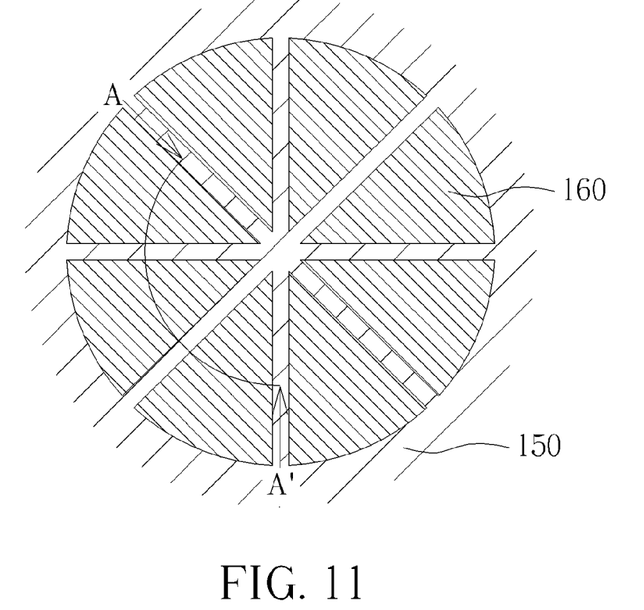

Please refer to FIGS. 8-11, wherein FIGS. 8-11 are top views of the back side of the APD structure 200 provided the present invention, and FIG. 7 is a cross-sectional view taken along a line A-A' of FIGS. 8-11. More important, FIGS. 8-11 illustrate different embodiments for the heat sinks 150 and the reflecting islands 160. As shown in FIG. 8, in an embodiment of the present invention, at least one reflecting island 160 is disposed correspondingly to a center of the APD device 200, and as shown in FIG. 7, that reflecting island 160 is aligned with the APD structure 130. And the heat sinks 150 surround the central reflecting island 160. The heat sinks 150 include a radial pattern as shown in FIG. 8. It is noteworthy that the reflecting islands 160 are always spaced apart from each other by the heat sinks 150. As shown in FIG. 9, in another embodiment of the present invention, the heat sinks 150 include a concentric circle pattern and the reflecting islands 160 are disposed in between each concentric circle and thus are spaced apart from each other by the heat sinks 150. It is noteworthy that in the embodiment, at least a reflecting island 160 is preferably aligned with the APD structure 130, as shown in FIG. 7. As shown in FIG. 10, in another embodiment of the present invention, the heat sinks 150 include a mesh pattern and the reflecting islands 160 are disposed in the mesh openings. And thus the reflecting islands 160 are spaced apart from each other by the heat sinks 150. It is noteworthy that in the embodiment, at least a reflecting island 160 is preferably aligned with the APD structure 130, as shown in FIG. 7. As shown in FIG. 10, in still another embodiment of the present invention, the heat sinks 150 include a radial pattern and the reflecting islands 160 are spaced apart from each other by the heat sinks 150.

Please refer to FIG. 7 again. According to the APD device and the manufacturing method thereof provided by the present invention, the heat sinks 150 and the reflecting islands 160 are formed on the back side 100B of the substrate 100 after forming the APD structure 130 on the front side 100F of the substrate 100. As shown in FOG. 7, at least one of the reflecting islands 160 is preferably aligned with the APD structure 130. Consequently, lights passing through the APD structure 130 are reflected and redirected back to the APD structure 130, and thus responsibility and sensitivity of the APD device 200 are both improved at least 2 dBm, but not limited to this. More important, though the reflecting islands 160 increase light reflections and thus improve the responsibility and the sensitivity, it block the contact between the APD structure 130 and ambience air. Consequently, heat dissipation is reduced. However, due to the heat sinks 150, thermal paths B and contact areas between the APD device 200 and ambience air are increased. Therefore, heat dissipation is improved and overheat impacts to the device performance is diminished.

Figure 12:
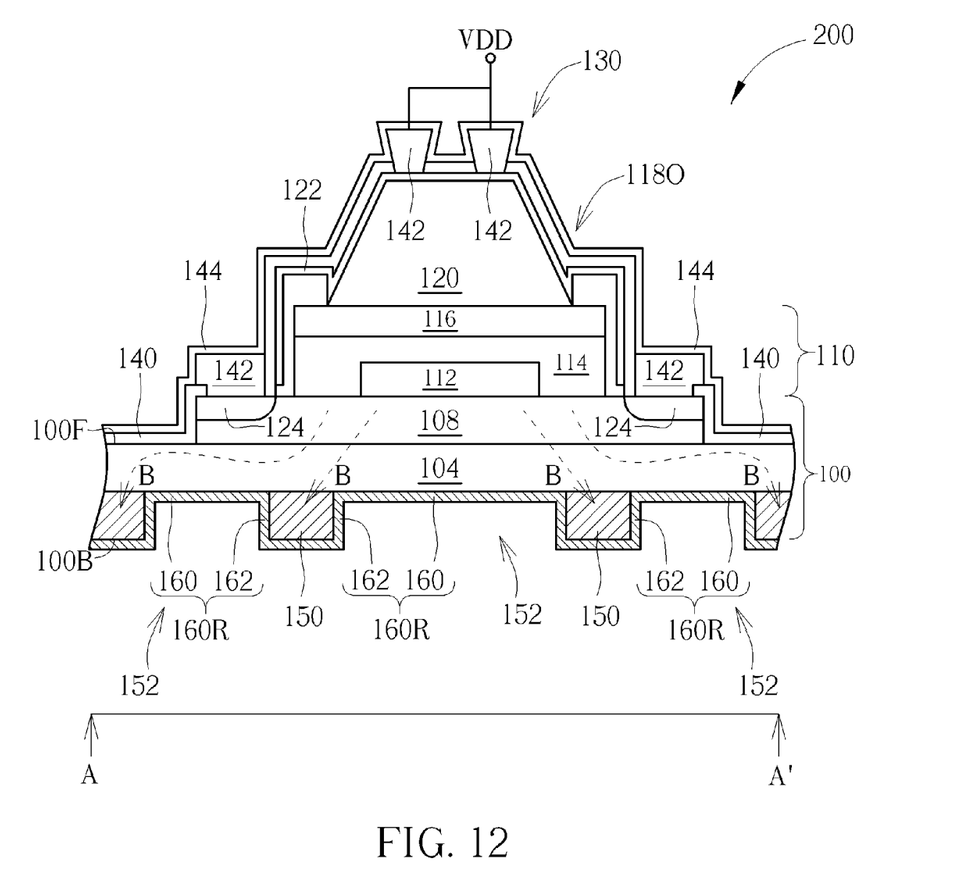
FIG. 12 is a schematic drawing illustrating an APD device provided by a second preferred embodiment of the present invention.

Please refer to FIG. 12, which is a schematic drawing illustrating and APD device provided by a second preferred embodiment of the present invention. It is noteworthy that elements the same in the first and second preferred embodiments are designated by the same numerals. Furthermore, elements the same in the first and second preferred embodiments can include the same material and be formed by the same method, therefore those details are omitted in the interest of brevity. The difference between the first and the second embodiments is: After forming the heat sinks 150 and the recesses 152, not only the reflecting islands 160 are formed on the bottoms of the recesses 152, but also a plurality of reflecting layers 162 are formed on the back side 100B of the substrate 100. According to the preferred embodiment, the reflecting layers 162 cover sidewalls of the recesses 152 and top surfaces of the heat sinks 150 as shown in FIG. 12. Furthermore, the reflecting layers 162 contact the reflecting islands 160 and thus to a continuous reflecting film 160R on the back side 100B of the substrate 100.

According to the second embodiment, the reflecting islands 160 and the reflecting layers 162 form the continuous reflecting film 160R, therefore the lights passing through the APD structure 130 are reflected and redirected back to the APD structure 130 by the continuous reflecting film 160R while thermal paths are increased due to the heat sinks 150. Consequently, the responsibility and the sensitivity of the APD device 200 are both improved and overheat impacts to the device performance is diminished.

Briefly speaking, according to the APD device provided by the present invention, at least an APD structure is formed on the front side of the substrate while the reflecting islands and the heat sinks are formed on the back sides of the substrate. Accordingly, lights passing through the APD structure are reflected back to the APD structure by the reflecting islands and thus responsibility and sensitivity of the APD device are both improved. More important, the heat sinks improve heat dissipation. Consequently, impact to the device performance due to overheat is diminished.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An avalanche photodetector (APD) device comprising:
a substrate comprising a front side and a back side;
at least an APD structure disposed on the front side of the substrate;
a plurality of heat sinks disposed on the back side of the substrate; and
a plurality reflecting islands disposed on the back side of the substrate.
2. The APD device according to claim 1, wherein the plurality of heat sinks comprise a semiconductor material and the plurality of reflecting islands comprise metal materials.

3. The APD device according to claim 2, wherein the semiconductor material of the plurality of heat sinks is the same with at least a portion of the substrate.

4. The APD device according to claim 1, wherein the plurality of heat sinks comprise a concentric circle pattern, a radial pattern, or a mesh pattern.

5. The APD device according to claim 1, wherein the plurality of reflecting islands are spaced apart from each other by the plurality of heat sinks, respectively.

6. The APD device according to claim 1, wherein a thickness of each respective heat sink of the plurality of heat sinks is larger than a thickness of each respective reflecting islands of the plurality of reflecting islands.

7. The APD device according to claim 1, further comprising a plurality of recesses defined in between adjacent heat sinks of the plurality of heat sinks.

8. The APD device according to claim 7, wherein the plurality of reflecting islands are disposed in bottoms of the plurality of recesses, respectively.

9. The APD device according to claim 8, further comprising a plurality of reflecting layers formed on sidewalls of the plurality of recesses and top surfaces of the plurality of heat sinks, respectively.

10. The APD device according to claim 9, wherein the plurality of reflecting layers contact the plurality of reflecting islands to form a continuous reflecting film.

11. The APD device according to claim 1, wherein the APD structure comprises at least an n-doped semiconductor layer, an intrinsic semiconductor layer, a p-doped semiconductor layer, and an epitaxial semiconductor layer.

12. A method for manufacturing an avalanche photodetector (APD) device, comprising:
    providing a substrate comprising a front side and a back side;
    forming an APD structure on the front side of the substrate;
    patterning the back side of the substrate to form a plurality of heat sinks on the back side of the substrate and a plurality of recesses defined in between adjacent heat sinks of the plurality of heat sinks; and
    forming a plurality of reflecting islands on bottoms of the plurality of recesses, respectively.

13. The method for manufacturing the APD device according to claim 12, wherein the step of forming the APD structure further comprises;
    forming a semiconductor mesa on the front side of the substrate; and
    forming an epitaxial semiconductor layer on the semiconductor mesa.

14. The method for manufacturing the APD device according to claim 13, wherein the semiconductor mesa comprises at least an n-doped semiconductor layer, an intrinsic semiconductor layer, and a p-doped semiconductor layer.

15. The method for manufacturing the APD device according to claim 12, wherein the plurality of heat sinks comprise a semiconductor material and the plurality of reflecting islands comprise metal materials.

16. The method for manufacturing the APD device according to claim 12, wherein the plurality of heat sinks comprise a concentric circle pattern, a radial pattern or a mesh pattern.

17. The method for manufacturing the APD device according to claim 12, wherein the plurality of reflecting islands are spaced apart from each other by the plurality of heat sinks, respectively.

18. The method for manufacturing the APD device according to claim 12, further comprising forming a plurality of reflecting layers on the back side of the substrate, and the plurality of reflecting layers covering sidewalls of the plurality of recesses and top surfaces of the plurality of heat sinks, respectively.

19. The method for manufacturing the APD device according to claim 18, wherein the plurality of reflecting layers contact the plurality of reflecting islands to form a continuous reflecting film on the back side of the substrate.

* * * * *